US009698164B2

(12) United States Patent
Morosawa et al.

(10) Patent No.: US 9,698,164 B2
(45) Date of Patent: Jul. 4, 2017

(54) DISPLAY AND ELECTRONIC UNIT

(71) Applicant: Sony Corporation, Tokyo (JP)

(72) Inventors: Narihiro Morosawa, Kanagawa (JP); Toshiaki Arai, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 13/722,339

(22) Filed: Dec. 20, 2012

(65) Prior Publication Data
US 2013/0153893 A1 Jun. 20, 2013

(30) Foreign Application Priority Data

Dec. 20, 2011 (JP) .................................. 2011-278266

(51) Int. Cl.
*H01L 27/13* (2006.01)
*H01L 27/32* (2006.01)
*H01L 27/12* (2006.01)
*G02F 1/1362* (2006.01)

(52) U.S. Cl.
CPC ...... *H01L 27/1225* (2013.01); *H01L 27/1255* (2013.01); *H01L 27/1259* (2013.01); *H01L 27/3262* (2013.01); *H01L 27/3265* (2013.01); *G02F 1/136213* (2013.01); *H01L 2227/323* (2013.01)

(58) Field of Classification Search
CPC ........... G02F 1/136213; H01L 27/1225; H01L 27/1255; H01L 27/326
USPC ..................... 257/43, 49, E27.131
See application file for complete search history.

(56) References Cited

U.S. PATENT DOCUMENTS

| | | | | |
|---|---|---|---|---|
| 2004/0233374 A1* | 11/2004 | Yamazaki et al. | ............ | 349/153 |
| 2009/0278131 A1* | 11/2009 | Kwon et al. | .................... | 257/72 |
| 2010/0140613 A1 | 6/2010 | Kimura | | |
| 2010/0163865 A1* | 7/2010 | Arai | ................................ | 257/43 |
| 2010/0224872 A1* | 9/2010 | Kimura | ............................ | 257/43 |
| 2011/0058116 A1 | 3/2011 | Yamazaki et al. | | |
| 2011/0084271 A1* | 4/2011 | Yamazaki et al. | ............... | 257/43 |
| 2011/0240998 A1* | 10/2011 | Morosawa et al. | ............. | 257/57 |
| 2012/0126376 A1* | 5/2012 | Honda et al. | ................. | 257/632 |
| 2012/0261657 A1* | 10/2012 | Takahashi et al. | ............. | 257/43 |

FOREIGN PATENT DOCUMENTS

| | | | |
|---|---|---|---|
| JP | 10-133233 | | 5/1998 |
| JP | 10133233 A | * | 5/1998 |
| JP | 2007-220817 | | 8/2007 |

OTHER PUBLICATIONS

Park, et al., "Self-aligned top-gate amorphous gallium indium zinc oxide thin film transistors", Applied Physics Letters 93, 053502, 2008.
Hayashi, et al., "Improved Amorphous In—Ga—Zn—O TFTs", SID 08 Digest, 621.

* cited by examiner

*Primary Examiner* — Marcos D Pizarro
(74) *Attorney, Agent, or Firm* — K&L Gates LLP

(57) ABSTRACT

A display device includes a display element, a transistor configured to drive the display element, the transistor including a channel region, and a retention capacitor. An oxide semiconductor film is provided in areas across the transistor and the retention capacitor, the oxide semiconductor film including a first region formed in the channel region of the transistor, and a second region having a lower resistance than that of the first region. The second region is formed in the areas of the transistor and retention capacitor other than in the channel region.

12 Claims, 15 Drawing Sheets

210
220

210
220

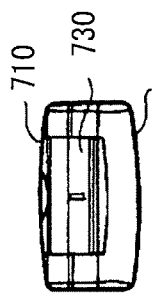
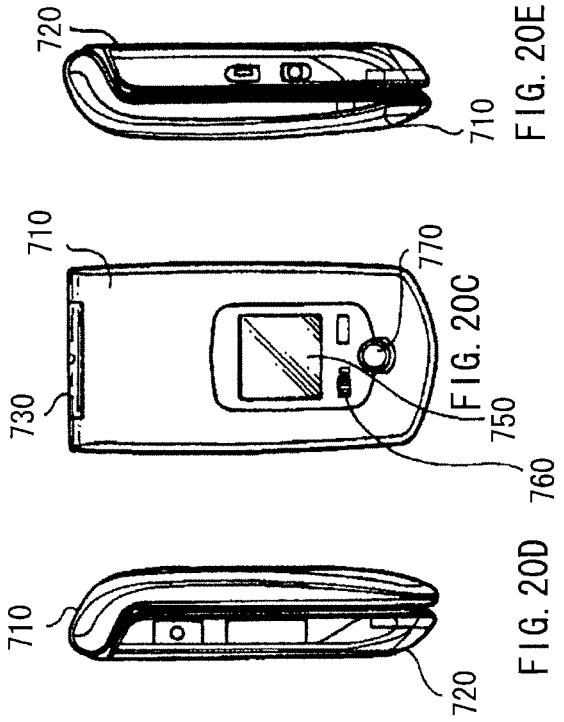
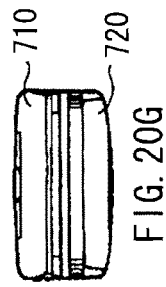
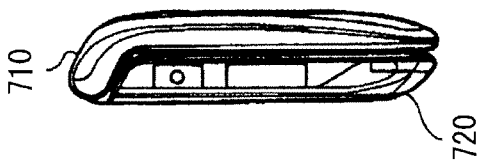
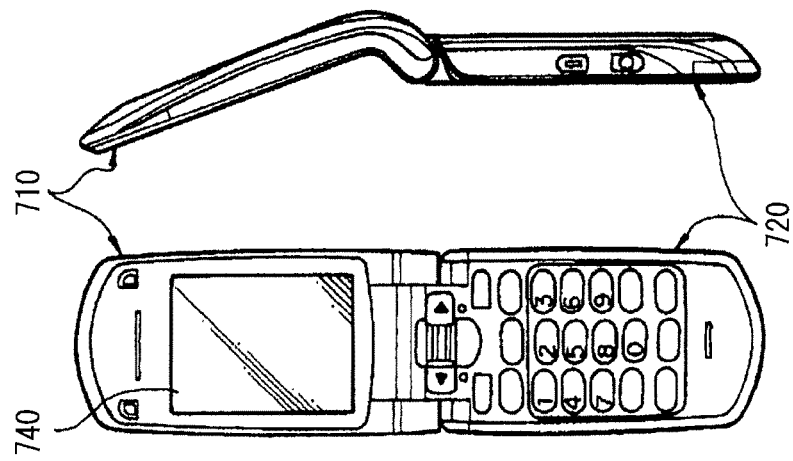

DISPLAY AND ELECTRONIC UNIT

CROSS REFERENCES TO RELATED APPLICATIONS

The present application claims priority to Japanese Priority Patent Application JP 2011-278266 filed in the Japan Patent Office on Dec. 20, 2011, the entire content of which is hereby incorporated by reference.

BACKGROUND

This disclosure relates to a display including a thin film transistor using an oxide semiconductor, and to an electronic unit including the display.

In an active drive liquid crystal display or an active drive organic EL display, a thin film transistor is used as a drive device, and a charge corresponding to a signal voltage for writing an image is retained in a retention capacity. However, if a parasitic capacity generated in an intersected region between a gate electrode and a source electrode or a drain electrode of the thin film transistor is increased, the signal voltage is varied, thereby resulting in image quality deterioration.

In particular, in the organic EL display, when the parasitic capacity is large, the retention capacity is necessary to be increased, and thus a proportion of wirings and the like is increased in layout of pixels. As a result, probability of short circuit between wirings and the like is increased, thereby decreasing manufacturing yield.

Accordingly, in related art, as for a thin film transistor using oxide semiconductors such as zinc oxide (ZnO) and indium gallium zinc oxide (IGZO) for a channel, it has attempted to decrease a parasitic capacity formed in an intersected region between a gate electrode and a source electrode or a drain electrode.

For example, in Japanese Unexamined Patent Application Publication No. 2007-220817 and in "Self-aligned top-gate amorphous gallium indium zinc oxide thin film transistors", J. Park, et al., Applied Physics Letters, American Institute of Physics, 2008, Vol. 93, 053501, there is disclosed a self-aligned top-gage thin film transistor in which a gate electrode and a gate insulating film are formed to have the same shape on a channel region of an oxide semiconductor thin film layer, and then a region not covered with the gate electrode and the gate insulating film of the oxide semiconductor thin film layer is reduced in resistance to form a source/drain region. In addition, in "Improved Amorphous In—Ga—Zn—O TFTs", R. Hayashi, et al., SID 08 DIGEST, 2008, 42. 1, p. 621-624, there is disclosed a bottom gate thin film transistor having a self-aligned structure in which a source region and a drain region are formed on an oxide semiconductor film by backside exposure with use of a gate electrode as a mask.

SUMMARY

In a retention capacitor provided on a substrate, together with the transistor using an oxide semiconductor, image quality deterioration is desirably suppressed by maintaining a desired capacity.

It is desirable to provide a display and an electronic unit which are capable of suppressing image quality deterioration.

According to an embodiment of the disclosure, there is provided A display device includes a display element, a transistor configured to drive the display element, the transistor including a channel region, and a retention capacitor. An oxide semiconductor film is provided in areas across the transistor and the retention capacitor, the oxide semiconductor film including a first region formed in the channel region of the transistor, and a second region having a lower resistance than that of the first region. The second region is formed in the areas of the transistor and retention capacitor other than in the channel region.

According to another embodiment of the disclosure, an electronic apparatus is provided including a display device. The display device includes a display element, a transistor configured to drive the display element, the transistor including a channel region, and a retention capacitor. A first oxide semiconductor film is formed in areas of the transistor and retention capacitor including the channel region, and a second lower resistance oxide semiconductor film is formed on the first oxide semiconductor film in the areas of the transistor and retention capacitor except in the channel region.

According to another embodiment of the disclosure, a method of manufacturing a display device including a display element, a transistor configured to drive the display element, and a retention capacitor is provided. The method includes: forming an oxide semiconductor film in areas across the transistor and the retention capacitor, the oxide semiconductor film including a first region formed in a channel region of the transistor, and a second region having a lower resistance than that of the first region, the second region formed in the areas of the transistor and retention capacitor other than in the channel region.

In the display according to the embodiment of the disclosure, the low-resistance region with a resistivity lower than that of the channel region is provided in a part or all in a thickness direction from a surface of a region other than the channel region of the oxide semiconductor film. The inter-layer insulating film has a multilayer structure including the inorganic insulating film as a layer closest to the low-resistance region. The retention capacitor has, with the inorganic insulating film in between, the low resistance region as the one electrode and the conductive film provided on the opposite side of the inorganic insulating film, as the other electrode. As a result, in the retention capacitor, capacity variation depending on the applied voltage is reduced, and thus a desired capacity is maintained.

According to an embodiment of the disclosure, there is provided an electronic unit having a display. The display includes, on a substrate: a transistor and a retention capacitor sharing an oxide semiconductor film; a display device driven by the transistor; and an inter-layer insulating film provided between the display device and both the transistor and the retention capacitor. The oxide semiconductor film has a channel region of the transistor, and a low-resistance region formed in a part or all in a thickness direction from a surface of a region other than the channel region, the low-resistance region having a resistivity lower than a resistivity of the channel region. The inter-layer insulating film has a multilayer structure including an inorganic insulating film as a layer closest to the low-resistance region. The retention capacitor has, with the inorganic insulating film in between, the low resistance region as one electrode and a conductive film as the other electrode, the conductive film being provided on an opposite side of the inorganic insulating film.

In the electronic unit of the embodiment of the disclosure, the display operation is performed by the above-described display.

In the display or the electronic unit according to the embodiment of the disclosure, the low-resistance region with a resistivity lower than that of the channel region is provided in a part or all in a thickness direction from a surface of a region other than the channel region. In addition, the inter-layer insulating film has a multilayer structure including the inorganic insulating film as a layer closest to the low-resistance region, and the retention capacitor is configured to have, with the inorganic insulating film in between, the low-resistance region as the one electrode and the conductive film provided on the opposite side of the inorganic insulating film, as the other electrode. Accordingly, in the retention capacitor, capacity variation depending on the applied voltage is reduced, the desired capacity is allowed to be maintained, and therefore the image quality deterioration is allowed to be suppressed.

Additional features and advantages are described herein, and will be apparent from the following Detailed Description and the figures.

BRIEF DESCRIPTION OF THE FIGURES

FIG. 13 is a plan view illustrating a schematic configuration of a module including the display according to any of the embodiments and the like.

FIGS. 14A and 14B are perspective views each illustrating an appearance of an application example 1 of the display according to any of the embodiments and the like.

FIG. 20A is a front view of an application example 6 in an open state, FIG. 20B is a side view thereof, FIG. 20C is a front view in a closed state, FIG. 20D is a left side view, FIG. 20E is a right side view, FIG. 20F is a top view, and FIG. 20G is a bottom view.

DETAILED DESCRIPTION

Embodiments of the present application will be described below in detail with reference to the drawings.

1. First embodiment (Example of an organic EL display including a retention capacitor which has, with an inorganic insulating film in between, an low-resistance region of an oxide semiconductor film as one electrode and a conductive film provided between the inorganic insulating film and an organic insulating film as the other electrode)

2. Second embodiment (Example in which a conductive film of a retention capacitor is formed of a transparent conductive material)

3. Modification 1 (Example of a liquid crystal display)

4. Modification 2 (Example of an electronic paper display)

5. Application Examples (Examples of a module and electronic units)

First Embodiment

Figure 1:
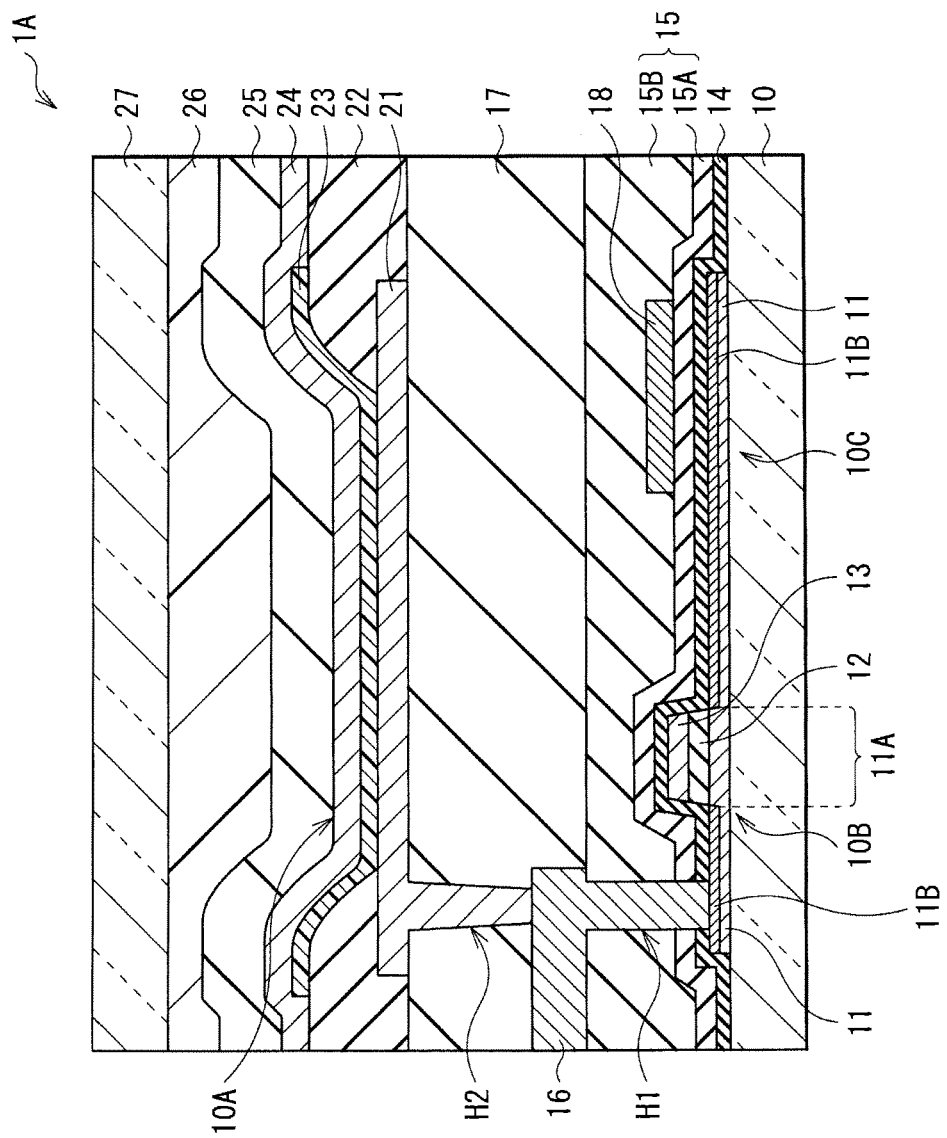
FIG. 1 is a sectional view illustrating a configuration of an organic EL display according to a first embodiment of the disclosure.

FIG. 1 illustrates a cross-sectional configuration of a display (an organic EL display 1A) according to a first embodiment of the disclosure. The organic EL display 1A includes a plurality of pixels (organic EL devices 10A) which are driven by, for example, an active matrix driving method. Incidentally, FIG. 1 illustrates only a region corresponding to one pixel (sub-pixel). In the organic EL display 1A, for example, a transistor 10B and a retention capacitor 10C which share an oxide semiconductor film 11 are disposed on a drive-side substrate 10, and an organic EL device 10A is provided on a layer above the transistor 10B and the retention capacitor 10C. An emission system of the organic EL display 1A may be a so-called top emission type or a bottom emission type. The detailed configuration of each of the organic EL device 10A, the transistor 10B, and the retention capacitor 10C will be described below.

[Organic EL Device 10A]

In the organic EL device 10A, a pixel separation film 22 having an aperture for each pixel is provided on a first electrode 21, and an organic layer 23 is provided in the aperture of the pixel separation film 22. A second electrode 24 is provided on the organic layer 23. The organic EL device 10A is sealed by a protection layer 25, for example. A sealing substrate 27 is bonded to the protection layer 25 with an adhesive layer 26 made of a thermosetting resin, an ultraviolet curable resin, or the like in between.

The first electrode 21 functions as an anode, for example, and is provided for each pixel. In the case of the bottom emission type, the first electrode 21 is configured of a transparent conductive film, for example, a single-layer film made of one of indium tin oxide (ITO), indium zinc oxide (IZO or InZnO), or a laminated film made of two or more thereof. In the case of the top emission type, the first electrode 21 is configured of, for example, a simple metal of one or more of aluminum (Al), magnesium (Mg), calcium (Ca), and sodium (Na), a single-layer film made of an alloy containing one or more thereof, or a multilayer film configured by stacking two or more thereof.

The pixel separation film 22 separates an emission region of each of the pixels, and is formed of a photosensitive resin such as a polyimide, an acrylic resin, and a novolac-based resin.

The organic layer 23 includes an organic electroluminescence layer (an organic EL layer), and performs light emission in response to application of a drive current. The organic layer 23 is configured by stacking, for example, a hole injection layer, a hole transport layer, the organic EL layer, and an electron transport layer (all not illustrated), in order from the drive-side substrate 10. The organic EL layer generates light by recombination of an electron and a hole in response to application of an electric field. The material of the organic EL layer is a typical low-molecular or high-molecular organic material, and is not particularly limited. In addition, light emission layer of each color of red, green, and blue may be painted for each pixel, or a white light-emission layer (configured by stacking emission layers of red, green, and blue, for example) may be provided over the entire surface of the substrate. The hole injection layer is provided to enhance a hole injection efficiency and to prevent leakage. The hole transport layer enhances a hole transport efficiency to the organic EL layer. The layers other than the organic EL layer may be provided as necessary.

The second electrode 24 functions as a cathode, for example, and is configured of a metal conductive film. In the case of the bottom emission type, the second electrode 24 is configured of a reflective metal film, for example, a simple metal of one or more of aluminum, magnesium, calcium, and sodium, a single-layer film made of an alloy containing one or more thereof, or a multilayer film configured by stacking two or more thereof. Alternatively, in the case of the top emission type, a transparent conductive film such as ITO and IZO is used. The second electrode 24 is formed on the organic layer 23 in a state of being insulated from the first electrode 21, and is provided in common to the pixels.

The protection film 25 may be formed of an insulating material or a conductive material. Examples of the insulating material include amorphous silicon (a-Si), amorphous silicon carbide (a-SiC), amorphous silicon nitride (a-Si1-xNx), and amorphous carbon (a-C).

Each of the drive-side substrate 10 and the sealing substrate 27 is a plate of, for example, quartz, glass, silicon, or plastic. The oxide semiconductor film 11 is formed without heating the drive-side substrate 10 in a sputtering method described later so that an inexpensive plastic film may be used. Examples of the plastic material include polyethylene terephthalate (PET) and polyethylene naphthalate (PEN). In addition, a metal substrate made of stainless steel (SUS) may be used depending on the purpose. Incidentally, in the case of the top emission type, the sealing substrate 27 is configured of a transparent substrate made of glass, plastic, or the like, and may include a color filter, a shielding film, and the like (all not illustrated). In the case of the bottom emission type, the drive-side substrate 10 is configured of a transparent substrate.

[Transistor 10B]

The transistor 10B corresponds to, for example, a sampling transistor Tr1 in a pixel drive circuit 50A described later or a drive transistor Tr2, and is a (so-called top gate type) thin film transistor having a staggered structure. In the transistor 10B, the oxide semiconductor film 11 is provided on the drive-side substrate 10. A gate electrode 13 is disposed in a selective region of the oxide semiconductor film 11 with a gate insulating film 12 in between. A high-resistance film 14 and an inter-layer insulating film 15 are provided to cover the oxide semiconductor film 11, the gate insulating film 12, and the gate electrode 13. A source/drain electrode layer 16 is provided on the inter-layer insulating film 15. The source/drain electrode layer 16 is electrically connected to a low-resistance region 11B (described later) of the oxide semiconductor film 11 through a contact hole H1 provided in the high-resistance film 14 and the inter-layer insulating film 15.

The oxide semiconductor film 11 forms a channel in response to application of a gate voltage, and has a thickness of, for example, about 50 nm. The oxide semiconductor film 11 is formed of an oxide semiconductor containing one or more of indium (In), gallium (Ga), zinc (Zn), silicon (Si), and tin (Sn). Examples of amorphous oxide semiconductor include indium tin zinc oxide (ITZO) and indium gallium zinc oxide (IGZO or InGaZnO). Examples of crystalline oxide semiconductor include zinc oxide (ZnO), indium zinc oxide (IZO), indium gallium oxide (IGO), ITO, and indium oxide (InO).

In the oxide semiconductor film 11, a region opposing to the gate electrode 13 (a region beneath the gate electrode 13) is a channel region 11A. On the other hand, a part in a thickness direction from a surface (a top surface) of a region other than the channel region 11A of the oxide semiconductor film 11 is the low-resistance region 11B having an electrical resistivity lower than that of the channel region 11A. The low-resistance region 11B is reduced in resistance by allowing a metal such as aluminum to be reacted and diffused into the oxide semiconductor in the manufacturing process described later. As a result, the transistor 10B is allowed to have a so-called self-aligned structure and to be stable in characteristics.

The oxide semiconductor film 11 and the low-resistance region 11B are provided in common to both the transistor 10B and the retention capacitor 10C. A region adjacent to the channel region 11A of the low-resistance region 11B is a source/drain region of the transistor 10B. In addition, as will be described later, the low-resistance region 11B includes a region corresponding to one electrode of the retention capacitor 10C.

The gate insulating film 12 has a thickness of, for example, about 300 nm, and is a single-layer film made of one of a silicon oxide film (SiOx), a silicon nitride film (SiNx), a silicon oxynitride film (SiON), and an aluminum oxide film (AlOx), or a laminated film made of two or more thereof. Among them, the silicon oxide film or the aluminum oxide film is preferable because the silicon oxide film and the aluminum oxide film are not likely to reduce the oxide semiconductor.

The gate electrode 13 controls a carrier density of the high-resistance film 14 with use of the gate voltage (Vg) applied to the transistor 10B, and has a function as a wiring supplying a potential. The gate electrode 13 is a simple substance made of one of molybdenum (Mo), titanium (Ti), aluminum, silver, neodymium (Nd), and copper (Cu) or alloy thereof, or a laminated film made of two or more thereof. Specifically, the laminated structure configured by sandwiching a low-resistance metal such as aluminum and silver by molybdenum or titanium, or an alloy of aluminum and neodymium (Al—Nd alloy) are exemplified. Alternatively, the gate electrode 13 may be configured of a transparent conductive film such as ITO. The thickness of the gate electrode 13 is, for example, about 10 nm to 500 nm both inclusive.

The high-resistance film 14 is a metal film remaining as an oxide film. The metal film is to be a supply source of a metal which is diffused into the low-resistance region 11B of the oxide semiconductor film 11 in the manufacturing process described later. The high-resistance film 14 has a thickness of for example, 20 nm or lower, and is formed of titanium oxide, aluminum oxide, indium oxide, tin oxide, or the like. Such a high-resistance film 14 has a favorable barrier property with respect to ambient air, and thus has a function of reducing the influence of oxygen and moisture which cause the change of the electrical characteristics of the oxide semiconductor film 11 in the transistor 10B, in addition to the above-described role on the process. With the high-resistance film 14, the electrical characteristics of the transistor 10B and the retention capacitor 10C are allowed to be stable, and the effect of the inter-layer insulating film 15 is allowed to be further improved.

The inter-layer insulating film 15 has a multilayer structure including an inorganic insulating film 15A and an organic insulating film 15B in this order from the low-resistance region 11B side. The inorganic insulating film 15A has a thickness of, for example, about 200 nm, and is a single-layer film made of one of a silicon oxide film, a silicon nitride film, a silicon oxynitride film, and an aluminum oxide film, or a laminated film made of two or more thereof. In particular, when a film having a high battier property, such as a silicon nitride film, a silicon oxynitride film, and an aluminum oxide film, or a multilayer film thereof is used, moisture is prevented from being mixed to or being diffused into the oxide semiconductor film 11, and therefore the electrical characteristics and reliability of the transistor 10B are allowed to be enhanced.

Concentration of hydrogen contained in the inorganic insulating film 15A is preferably equal to or lower than about $1 \times 10^{20}$ cm$^{-3}$, for example. This is because, when the hydrogen concentration is higher than $1 \times 10^{20}$ cm$^{-3}$, the oxide semiconductor film 11 may be adversely affected.

Moreover, the inorganic insulating film 15A is preferably formed by sputtering method. The inorganic insulating film 15A formed by sputtering method is allowed to have lower hydrogen concentration than that of an inorganic insulating film formed by CVD method, and thus the oxide semiconductor film 11 is prevented from being adversely affected.

The organic insulating film 15B has a thickness of, for example, about 2 μm, and is formed of an organic material such as acrylic resin, polyimide, and siloxane. By using such an organic material, the thickness of the organic insulating film 15B is easily increased, and a step formed after processing of the gate electrode 13 in the manufacturing process (described later) is also allowed to be sufficiently insulated.

The source/drain electrode layer 16 functions as a source electrode or a drain electrode of the transistor 10B. The source/drain electrode layer 16 has a thickness of, for example, about 200 nm, and is configured of any of metals similar to those for the gate electrode 13, or a transparent conductive film. The source/drain electrode layer 16 is preferably formed of a low-resistance metal such as aluminum and copper, and is more preferably a laminated film configured by sandwiching such a low-resistance metal by barrier layers made of titanium or molybdenum. With such a laminated film, drive with less wiring delay is possible. In addition, the source/drain electrode layer 16 is desirably provided while avoiding a region directly above the gate electrode 12, in order to prevent a parasitic capacity from being formed at an intersected region of the gate electrode 12 and the source/drain electrode layer 16.

A planarizing film 17 is provided to cover the inter-layer insulating film 15 and the source/drain electrode layer 16. The planarizing film 17 is made of, for example, polyimide or an acrylic resin, and is provided over the entire display region. The planarizing film 17 has a contact hole H2 for ensuring electrical connection between the source/drain electrode layer 16 of the transistor 10B and the first electrode 21 of the organic EL device 10A. The first electrode 21 is disposed on the planarizing film 17 so as to fill in the contact hole H2.

[Retention Capacitor 10C]

Figure 2:
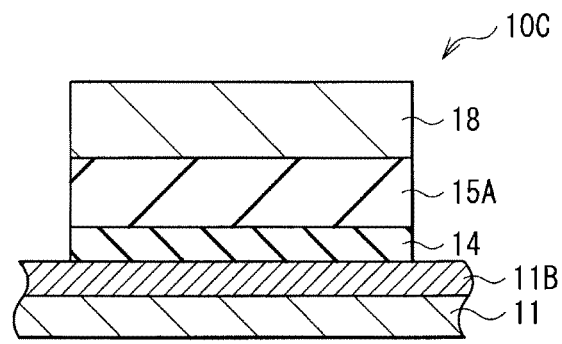
FIG. 2 is a sectional view illustrating a retention capacitor illustrated in FIG. 1 in an enlarged manner.

The retention capacitor 10C is a capacitor retaining a charge corresponding to an image signal in the pixel drive circuit 50A described later. FIG. 2 illustrates a cross-sectional configuration of the retention capacitor 10C in an enlarged manner. Specifically, the retention capacitor 10C has a structure configured by stacking the low-resistance region 11B of the oxide semiconductor film 11, the high-resistance film 14, the inorganic insulating film 15A, and the conductive film 18 in order from the drive-side substrate 10 side. The retention capacitor 10C is configured with the low-resistance region 11B as one electrode (a lower electrode) and the conductive film 18 as the other electrode (an upper electrode), with the high-resistance film 14 and the inorganic insulating film 15A in between. As a result, in the organic EL display 1A, image quality deterioration is allowed to be suppressed.

The low-resistance region 11B of the oxide semiconductor film 11 has a function as a source/drain region in the transistor 10B as described above, and has a function as the one electrode (the lower electrode) in the retention capacitor 10C. The low-resistance region 11B has a low resistivity substantially equivalent to that of a metal so that the variation of the capacity depending on an applied voltage is reduced. The low-resistance region 11B of the oxide semiconductor film 11 is (integrally) extended from the transistor 10B.

The high-resistance film 14 and the inorganic insulating film 15A are sandwiched by the low-resistance region 11B and the conductive film 18 to form a capacity, and are (integrally) extend from the transistor 10B. In this case, the retention capacitor 10C is configured to have a laminated structure with use of a part of each of the high-resistance film 14 and the inorganic insulating film 15A. As a result, a large capacity is allowed to be ensured.

The conductive film 18 is to be the other electrode (the upper electrode) of the retention capacitor 10C. The conductive film 18 is provided on an opposite side of the inorganic insulating film 15A from the low-resistance region 11B (between the inorganic insulating film 15A and the organic insulating film 15B), and is provided in a selective region separated from the transistor 10B. The conductive film 18 has a thickness of, for example, about 200 nm, and is configured of a single-layer film made of one of molybdenum (Mo), titanium (Ti), and aluminum (Al), or a multilayer film configured by stacking two or more thereof.

[Configuration of Peripheral Circuits and Pixel Circuit]

Figure 3:
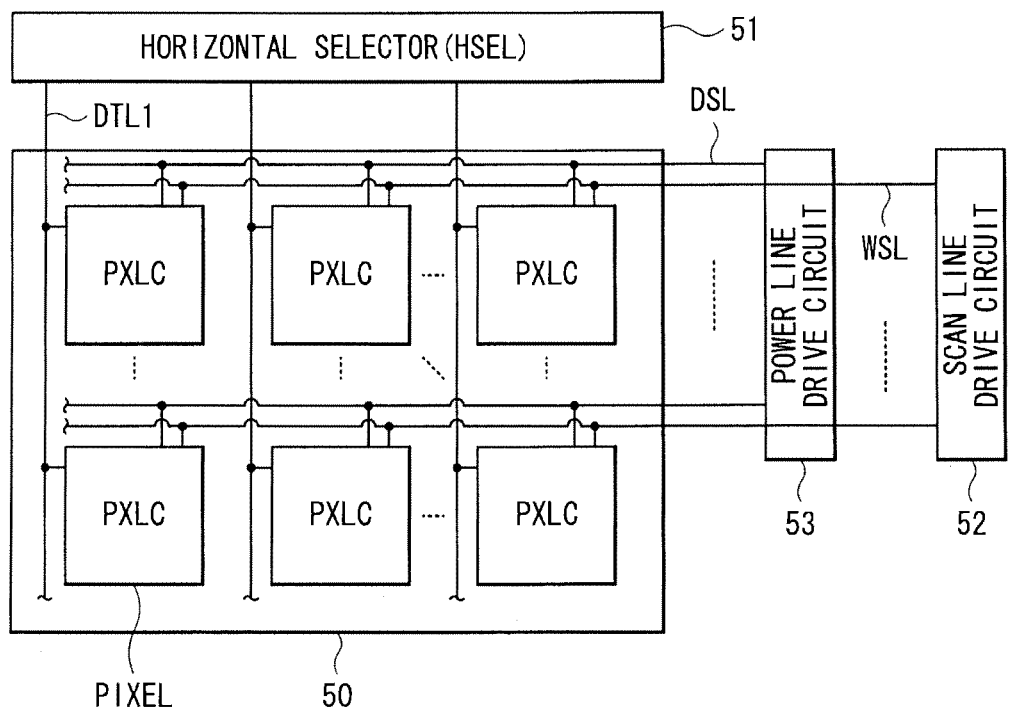
FIG. 3 is a diagram illustrating a general configuration including peripheral circuits of the organic EL display illustrated in FIG. 1.

Next, the configuration of the peripheral circuits and the pixel circuit of the above-described organic EL display 1A is described. FIG. 3 illustrates a general configuration including peripheral circuits of the organic EL display 1A. A plurality of pixels PXLC each including the organic EL device 10A is arranged in a matrix in a display region 50 on the drive-side substrate 10. Around the display region 50, a horizontal selector (HSEL) 51 as a signal line drive circuit, a write scanner (WSCN) 52 as a scan line drive circuit, and a power scanner (DSCN) 53 as a power line drive circuit are provided.

In the display region 50, a plurality of (an integer n) signal lines DTL1 to DTLn is arranged in a column direction, and a plurality of (an integer m) scan lines WSL1 to WSLm and a plurality of (an integer m) power lines DSL1 to DSLm are arranged in a row direction, respectively. In addition, each pixel PXLC (one of the pixels corresponding to R, G, and B) is provided at each intersection of each signal line DTL and each scan line WSL. Each signal line DTL is connected to the horizontal selector 51, and an image signal is supplied from the horizontal selector 51 to each signal line DTL. Each scan line WSL is connected to the write scanner 52, and a scan signal (a selection pulse) is supplied from the write scanner 52 to each scan line WSL. Each power line DSL is connected to the power scanner 53, and a power signal (a control pulse) is supplied from the power scanner 53 to each power line DSL.

Figure 4:
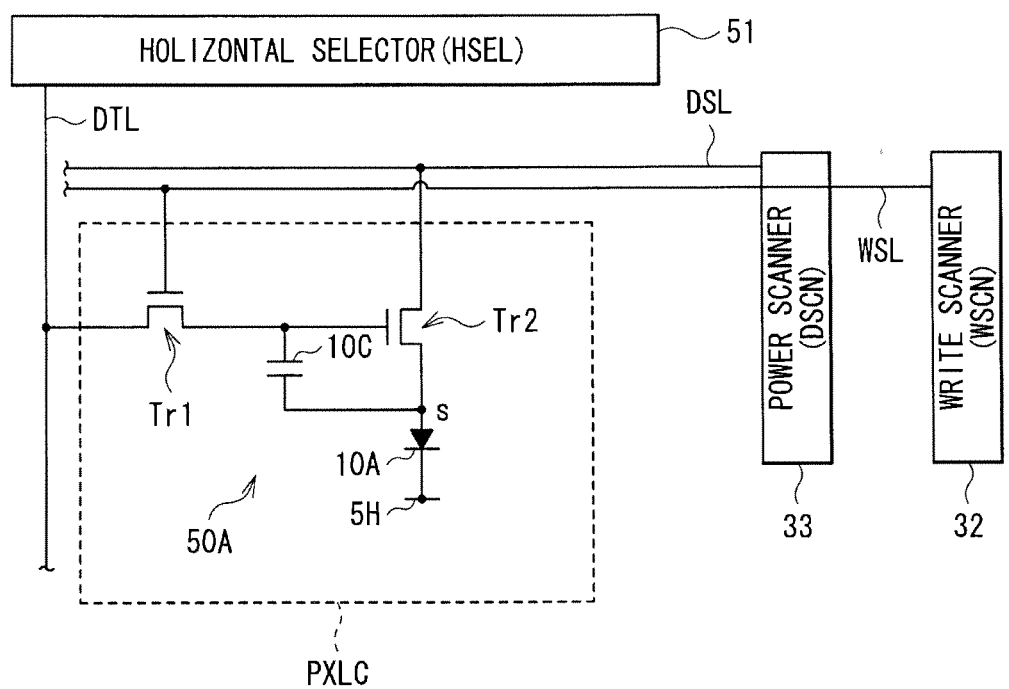
FIG. 4 is a diagram illustrating a circuit configuration of a pixel illustrated in FIG. 3.

FIG. 4 illustrates a specific example of a circuit configuration in the pixel PXLC. Each pixel PXLC includes the pixel circuit 50A including the organic EL device 10A. The pixel circuit 50A is an active drive circuit including the sampling transistor Tr1, a drive transistor Tr2, the retention capacitor 10C, and the organic EL device 10A. Note that the sampling transistor Tr1 (or the drive transistor Tr2) corresponds to the transistor 10B of the above-described embodiment.

A gate of the sampling transistor Tr1 is connected to the corresponding scan line WSL. One of a source and a drain of the sampling transistor Tr1 is connected to the corresponding signal line DTL, and the other is connected to a gate of the drive transistor Tr2. A drain of the drive transistor Tr2 is connected to the corresponding power line DSL, and a source of the drive transistor Tr2 is connected to an anode of the organic EL device 10A. A cathode of the organic EL device 10A is connected to a ground wiring 5H. Note that the ground wiring 5H is wired in common to all the pixels PXLC. The retention capacitor 10C is arranged between the source and the gate of the drive transistor Tr2.

The sampling transistor Tr1 samples a signal potential of the image signal supplied through the signal line DTL by being conductive in response to the scan signal (the selection pulse) supplied through the scan line WSL, and retains the signal potential in the retention capacitor 10C. The drive transistor Tr2 receives supply of a current through the power line DSL which is set at a predetermined first potential (not illustrated), and supplies the drive current to the organic EL device 10A based on the signal potential retained in the retention capacitor 10C. The organic EL device 10A emits light at luminance corresponding to the signal potential of the image signal by the drive current supplied from the drive transistor Tr2.

In such a circuit configuration, the sampling transistor Tr1 is made conductive in response to the scan signal (the selection pulse) supplied through the scan line WSL so that the signal potential of the image signal supplied through the signal line DTL is sampled and retained in the retention capacitor 10C. In addition, the current is supplied through the power line DSL set at the above-described first potential to the drive transistor Tr2, and the drive current is supplied to the organic EL device 10A (each organic EL device of red, green, and blue) based on the signal potential retained in the retention capacitor 10C. Then, each of the organic EL devices 10A emits light at the luminance corresponding to the signal potential of the image signal by the supplied drive current. As a result, the image is displayed based on the image signal in the display.

The organic EL display device 1A is manufactured in the following manner, for example.

[Process of Forming Transistor 10B and Retention Capacitor 10C]

Figure 5A:
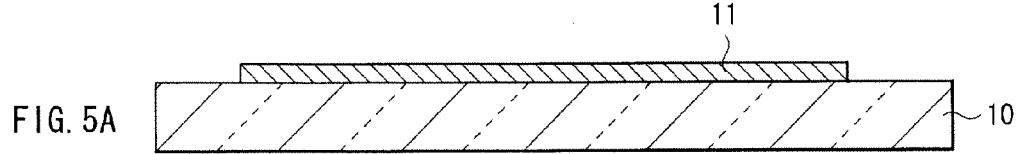
FIGS. 5A to 5C are sectional views illustrating a method of manufacturing the organic EL display illustrated in FIG. 1 in order of processes.

First, as illustrated in FIG. 5A, the oxide semiconductor film 11 made of the above-described material is formed on the drive-side substrate 10. Specifically, an oxide semiconductor material film (not illustrated) is formed by, for example, a sputtering method over the entire surface of the drive-side substrate 10. At this time, as a target, a ceramic having the same composition as an oxide semiconductor to be formed is used. Moreover, a partial pressure of oxygen is controlled so that desired transistor characteristics are obtained because the carrier concentration in the oxide semiconductor largely depends on the partial pressure of oxygen at the time of sputtering. Next, the formed oxide semiconductor material film is patterned into a predetermined shape by, for example, photolithography and etching. At this time, wet etching with use of a mixture of phosphoric acid, nitric acid, and acetic acid is preferably employed for processing. The mixture of phosphoric acid, nitric acid, and acetic acid allows a selection ratio with a base to be sufficiently increased, and processing is possible with relative ease.

Figure 5B:
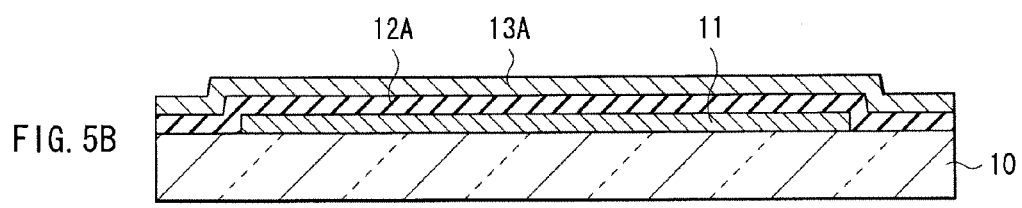

Subsequently, as illustrated in FIG. 5B, an insulating film 12A made of, for example, a silicon oxide film is formed by, for example, plasma CVD (chemical vapor deposition) method over the entire surface of the drive-side substrate 10. The silicon oxide film may be formed by reactive sputtering method, in addition to the plasma CVD method. In addition, in the case where an aluminum oxide film is formed, an atomic layer deposition method may be used, in addition to the reactive sputtering method and the CVD method.

After that, also as illustrated in FIG. 5B, a conductive film 13A made of a laminated film of molybdenum or titanium, and aluminum is formed by, for example, sputtering method over the entire surface of the insulating film 12A.

Figure 5C:
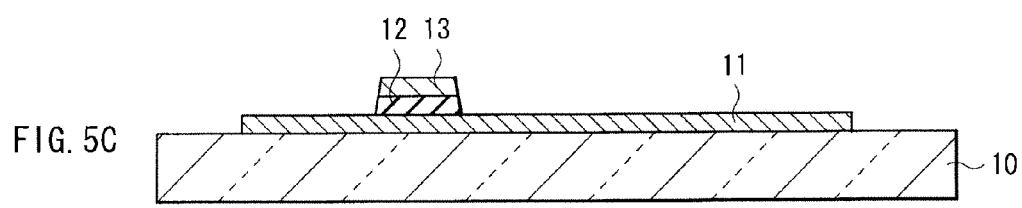

After the conductive film 13A is formed, as illustrated in FIG. 5C, the conductive film 13A is patterned by, for example, photolithography and etching to form the gate electrode 13 in a selective region on the oxide semiconductor film 11.

Subsequently, also as illustrated in FIG. 5C, the insulating film 12A is etched with use of the formed gate electrode 13 as a mask. At this time, in the case where the oxide semiconductor film 11 is formed of a crystalline material such as ZnO, IZO, and IGO, the processing is easily performed by maintaining an extremely large etching selection ratio with use of fluorine or the like. As a result, the gate insulating film 12 is patterned in the substantially same shape as the gate electrode 13.

Figure 6A:
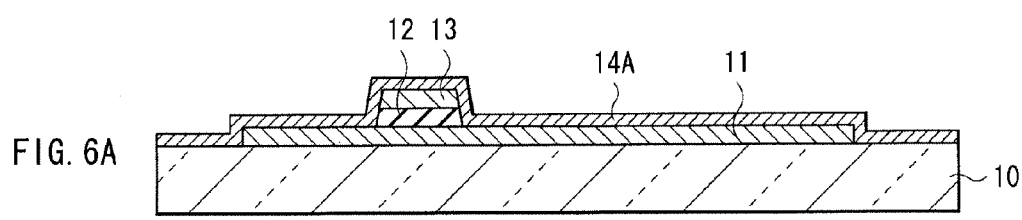
FIGS. 6A and 6B are sectional views illustrating processes following the process of FIG. 5C.

Then, as illustrated in FIG. 6A, a metal film 14A having a thickness of, for example, 5 nm or more and 10 nm or less is formed by, for example, sputtering method over the entire surface of the drive-side substrate 10. The metal film 14A is formed of a metal such as titanium, aluminum, and indium, which reacts with oxygen at a relatively low temperature.

Figure 6B:
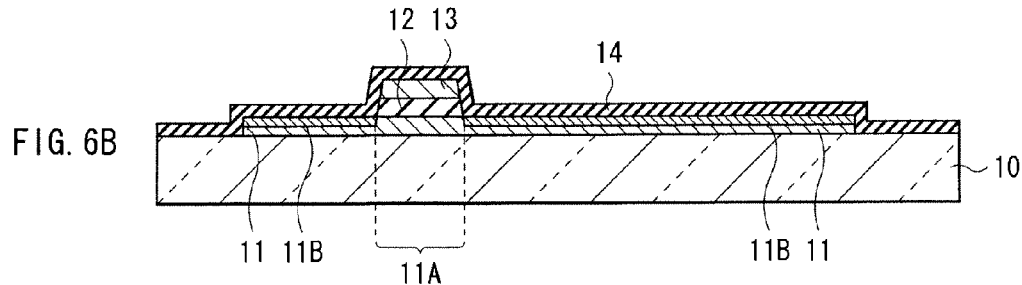

After that, as illustrated in FIG. 6B, the metal film 14A is oxidized by heat treatment performed at a temperature of for example, about 300° C., and therefore the high-resistance film 14 made of a metal oxide film is formed. At this time, the low-resistance region 11B (including the source/drain region) is formed in a region other than the channel region 11A of the oxide semiconductor film 11. The oxidation reaction of the metal film 14A uses part of oxygen contained in the oxide semiconductor. Therefore in the oxide semiconductor film 11, oxygen concentration is decreased from the surface (the top surface) side in contact with the metal film 14A, with progress of oxidation of the metal film 14A. On the other hand, metals such as aluminum are diffused from the metal film 14A into the oxide semiconductor film 11. The metal elements function as dopant and a region on the top surface side of the oxide semiconductor film 11 in contact with the metal film 14A is reduced in resistance. Accordingly, the low-resistance region 11B having electric resistance lower than that of the channel region 11A is formed.

Incidentally, as the heat treatment of the metal film 14A, annealing at a temperature of, for example, about 300° C. is preferable. At this time, when the annealing is performed in oxidized gas atmosphere containing oxygen and the like, oxygen concentration of the low-resistance region 11B is not excessively low, and thus sufficient oxygen is supplied to the oxide semiconductor film 11. Therefore, an annealing process in a subsequent process is allowed to be eliminated, thereby enabling simplification of the process.

Alternatively, the high-resistance film 14 may be formed in the following manner. For example, in the process illustrated in FIG. 6A, the metal film 14A may be formed while the temperature of the drive-side substrate 10 is maintained at a relatively high temperature of about 200° C. As a result, the predetermined region of the oxide semiconductor film 11 is reduced in resistance without performing the heat treatment illustrated in FIG. 6B. In this case, it is possible to reduce the carrier concentration of the oxide semiconductor film 11 to a level necessary as a transistor.

Moreover, the metal film 14A is preferably formed to have a thickness of, for example, 10 nm or less. When the thickness of the metal film 14A is equal to or lower than about 10 nm, the metal film 14A is totally oxidized (the high-resistance film 14 is formed) by the heat treatment. Incidentally, when the metal film 14A is not totally oxidized, a process of removing the unoxidized metal film 14A by etching is necessary. This is because the metal film 14A is also formed on the gate electrode 13A and the like, and if the metal film 14A is not sufficiently oxidized, leak current may occur. When the metal film 14A is totally oxidized and the high-resistance film 14 is formed, such a removing process is unnecessary and the manufacturing process is simplified. In other words, the leak current is prevented from occurring without performing the removing process by etching. Note that, when the metal film 14A is formed to have a thickness of 10 nm or less, the thickness of the high-resistance film 14 after the heat treatment is about 20 nm or less.

Further, as a method of oxidizing the metal film 14A, oxidation in water-vapor atmosphere, plasma oxidation, or the like may promote oxidation, in addition to the above-described heat treatment. In particular, in the case of the plasma oxidation, the following advantage is obtainable. After the formation of the high-resistance film 14, the inter-layer insulating film 15 is formed by plasma CVD method. The inter-layer insulating film 15 is allowed to be formed successively (continuously) after the metal film 14A is subjected to the plasma oxidation. Therefore, advantageously, the process is not necessarily added. In the plasma oxidation, for example, processing is desirably performed by generating plasma in gas atmosphere containing oxygen such a mixed gas of oxygen and nitrous oxide while the temperature of the drive-side substrate 10 is set at about 200° C. to about 400° C. As a result, the high-resistance film 14 having a favorable barrier property with respect to the ambient air is allowed to be formed.

In addition, as a method of allowing the predetermined region of the oxide semiconductor film 11 to be low in resistance, in addition to the method of reacting the metal film 14A with the oxide semiconductor film 11, a method using a plasma treatment, a method using formation of a silicon nitride film by plasma CVD method and hydrogen diffusion from the silicon nitride film, or the like may be used.

Figure 7A:
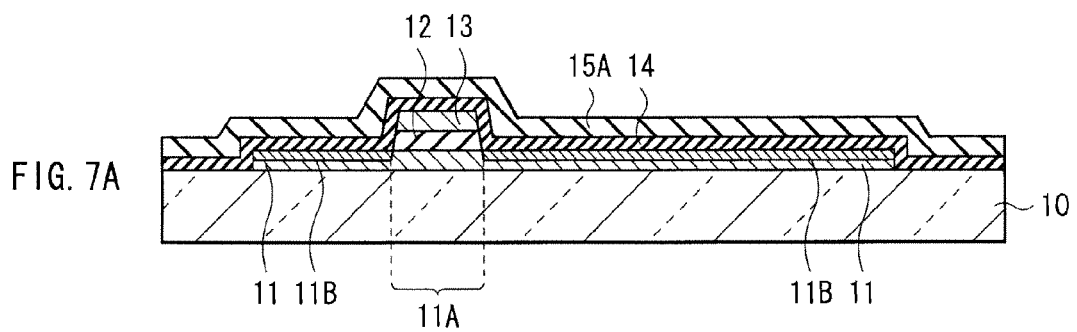
FIGS. 7A and 7B are sectional views illustrating processes following the process of FIG. 6B.

Next, as illustrated in FIG. 7A, the inorganic insulating film 15A made of the above-described material is formed over the entire surface of the high-resistance film 14 by, for example, plasma CVD method, sputtering method, or atomic layer deposition method.

In particular, the sputtering method is preferable. A silicon oxide film, a silicon nitride film, a silicon oxynitride film, an aluminum oxide film, and the like formed by the sputtering method allow hydrogen contained in the film to be largely reduced, unlike a film formed by plasma CVD method. Therefore, even when the annealing process is performed after the formation of the inorganic insulating film 15A, hydrogen diffuses into the oxide semiconductor film 11, thereby preventing the carrier concentration in the oxide semiconductor film 11 from being increased. In addition, a silicon nitride film and an aluminum oxide film have a high barrier property, and thus these films prevent impurity such as moisture from the outside from being diffused into the oxide semiconductor. As a result, reliability of the device is allowed to be enhanced.

In the case where the inorganic insulating film 15A is formed by the sputtering method, the inorganic insulating film 15A is desirably formed by reactive sputtering method by DC or AC power source using a conductive target such as silicon and aluminum. By using the method, the inorganic insulating film 15A is allowed to be formed at relatively high rate.

Figure 7B:
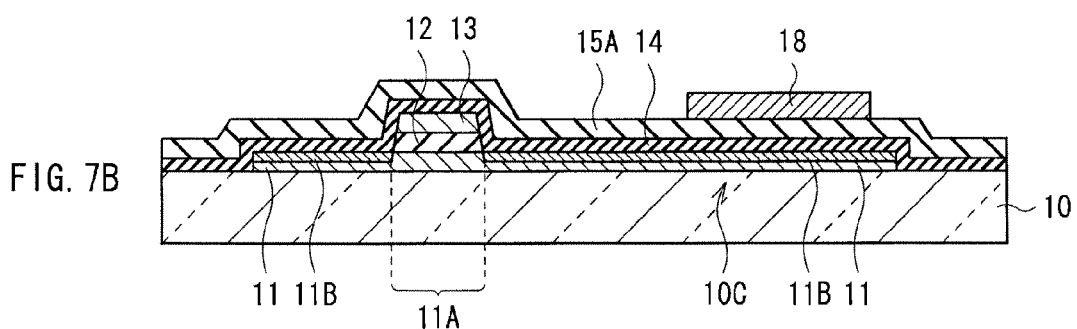

After that, as illustrated in FIG. 7B, the conductive film 18 which is to be the other electrode of the retention capacitor 10C is formed on the inorganic insulating film 15A. The conductive film 18 is formed by forming a metal film made of molybdenum (Mo) or the like with a thickness of about 200 nm by sputtering method, and then forming the metal film in a desired shape by photolithography and etching.

Figure 8:
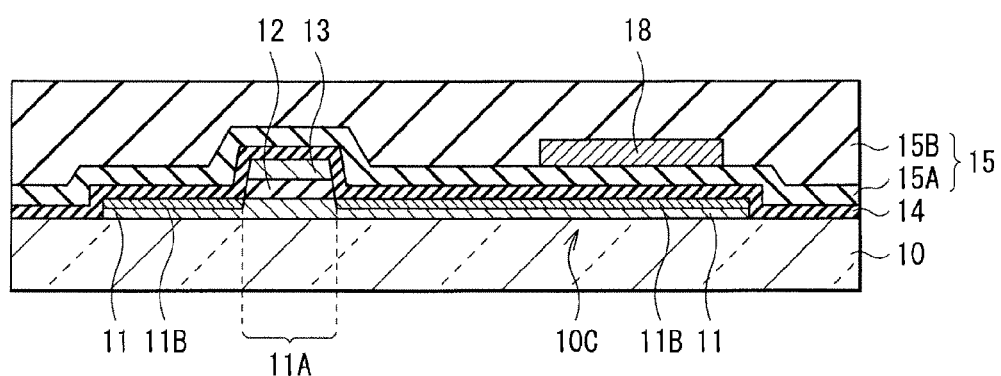
FIG. 8 is a sectional view illustrating a process following the process of FIG. 7B.

Subsequently, as illustrated in FIG. 8, the organic insulating film 15B made of the above-described material is formed on the inorganic insulating film 15A and the conductive film 18. The organic insulating film 15B is formed to have a thickness about 2 μm by applying the material with use of, for example, spin coating method or slit coating method. After that, exposure and development are performed to make the contact hole H1 at a predetermined position of the organic insulating film 15B.

Then, as illustrated in FIG. 1, the contact hole H1 penetrating through the inter-layer insulating film 15 and the high-resistance film 14 is formed on a part of a region opposing to the low-resistance region 11A of the oxide semiconductor film 11, by photolithography and etching, for example.

Subsequently, also as illustrated in FIG. 1, a conductive film (not illustrated) made of the above-described material, which is to be the source/drain electrode layer 16, is formed on the inter-layer insulating film 15 by sputtering method, for example, and the contact hole H1 is filled with the conductive film. After that, the conductive film is patterned into a predetermined shape by photolithography and etching, for example. As a result, the source/drain electrode layer 16 is formed on the inter-layer insulating film 15, and the source/drain electrode layer 16 is electrically connected to the low-resistance region 11B of the oxide semiconductor film 11 through the contact hole H1. Consequently, the transistor 10B and the retention capacitor 10C are formed on the drive-side substrate 10.

After that, the planarizing film 17 made of the above-described material is formed to cover the inter-layer insulating film 15 and the source/drain electrode layer 16 by spin coating method or slit coating method, and the contact hole H2 is formed on a part of a region opposing to the source/drain electrode layer 16.

[Process of Forming Organic EL device 10A]

Subsequently, the organic EL device 10A is formed on the planarizing film 17. Specifically, the first electrode 21 made of the above-described material is formed to fill the contact hole H2 on the planarizing film 17 by, for example, sputtering method, and the first electrode 21 is patterned by photolithography and etching. After that, the pixel separation film 22 having an aperture is formed on the first electrode 21, and the organic layer 23 is then formed by, for example, vacuum deposition method. Subsequently, the second electrode 24 made of the above-described material is formed on the organic layer 23 by, for example, sputtering method. Then, the protection layer 25 is formed on the second electrode 24 by CVD method, and the sealing substrate 27 is then bonded to the protection layer 25 with use of the adhesive layer 26. As a result, the organic EL display device 1A illustrated in FIG. 1 is completed.

In the organic EL display 1A, when a drive current corresponding to the image signal of each color is applied to each pixel corresponding to one of R, G, and B, electrons and holes are injected into the organic layer 23 through the first electrode 21 and the second electrode 24. The electrons and holes are recombined in the organic EL layer included in the organic layer 23, and emit light. In this way, in the organic EL display 1A, a image with full color of R, G, and B, for example, is displayed.

In the organic EL display 1A, at the time of the above-described image display operation, charges corresponding to the image signal are accumulated in the retention capacitor 10C when a potential corresponding to the image signal is applied to one end of the retention capacitor 10C. In this example, the retention capacitor 10C has a laminated structure in which the high-resistance film 14 and the inorganic insulating film 15A are sandwiched between the low-resistance region 11B of the oxide semiconductor film 11 and the conductive film 18. Therefore, the voltage supplied to the retention capacitor 10C is retained between the low-resistance region 11B and the conductive film 18, thereby reducing variation of the capacity caused by the applied voltage.

Figure 9A:
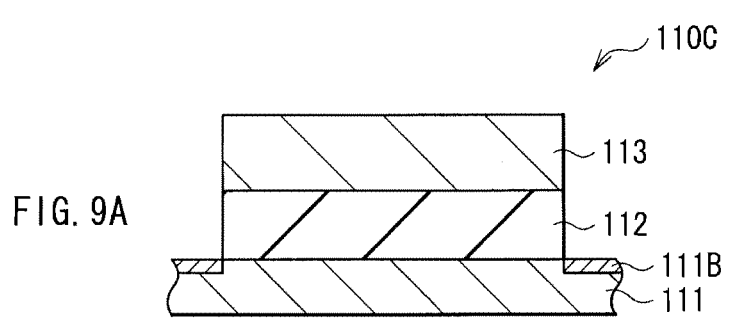
FIGS. 9A and 9B are sectional views each illustrating a configuration of a retention capacitor in related art.
Figure 9B:
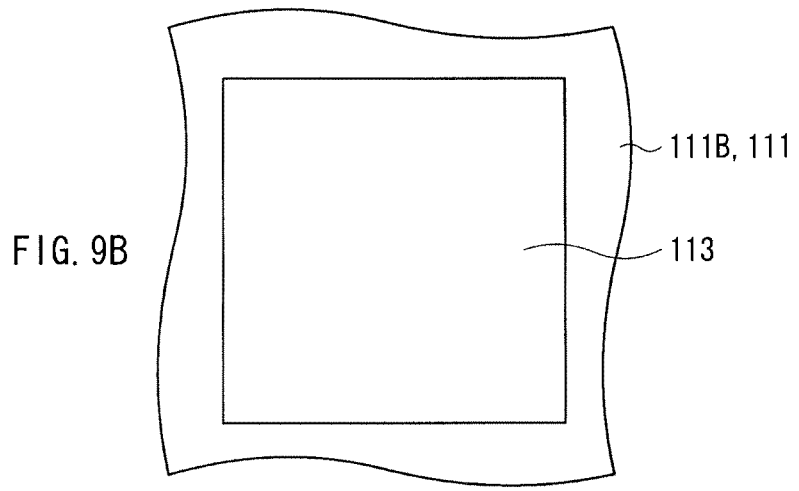

In contrast, in related art, as illustrated in FIGS. 9A and 9B, a conductive film 113 using a gate electrode is provided on an oxide semiconductor film 111 through an insulating film 112 using a gate insulating film, and the capacity is formed by the laminated structure. In such a retention capacitor 110C in related art, although a relatively large capacity is ensured similarly to the embodiment, the capacity is likely to be varied by the voltage applied between the oxide semiconductor film 111 and the conductive film 113. The capacity variation causes capacity shortage depending on a drive condition of a pixel circuit, thereby resulting in image quality deterioration.

As described above, in the embodiment, the retention capacitor 10C is configured with the low-resistance region 11B as one electrode and the conductive film 18 provided between the inorganic insulating film 15A and the organic insulating film 15B as the other electrode, with the high-resistance film 14 and the inorganic insulating film 15A in between. Therefore, in the retention capacitor 10C, capacity variation depending on the applied voltage is reduced, and the desired capacity is maintained. As a result, image quality deterioration is allowed to be suppressed.

In addition, it is possible to display an image with high quality on an active drive display, and to satisfy requirements for a large screen, high definition, and high frame rate.

Furthermore, since the relatively large capacity is ensured, the proportion of the wirings is allowed to be reduced also in layout of pixels, and therefore a panel with less defects and high yield is allowed to be manufactured.

Second Embodiment

Figure 10:
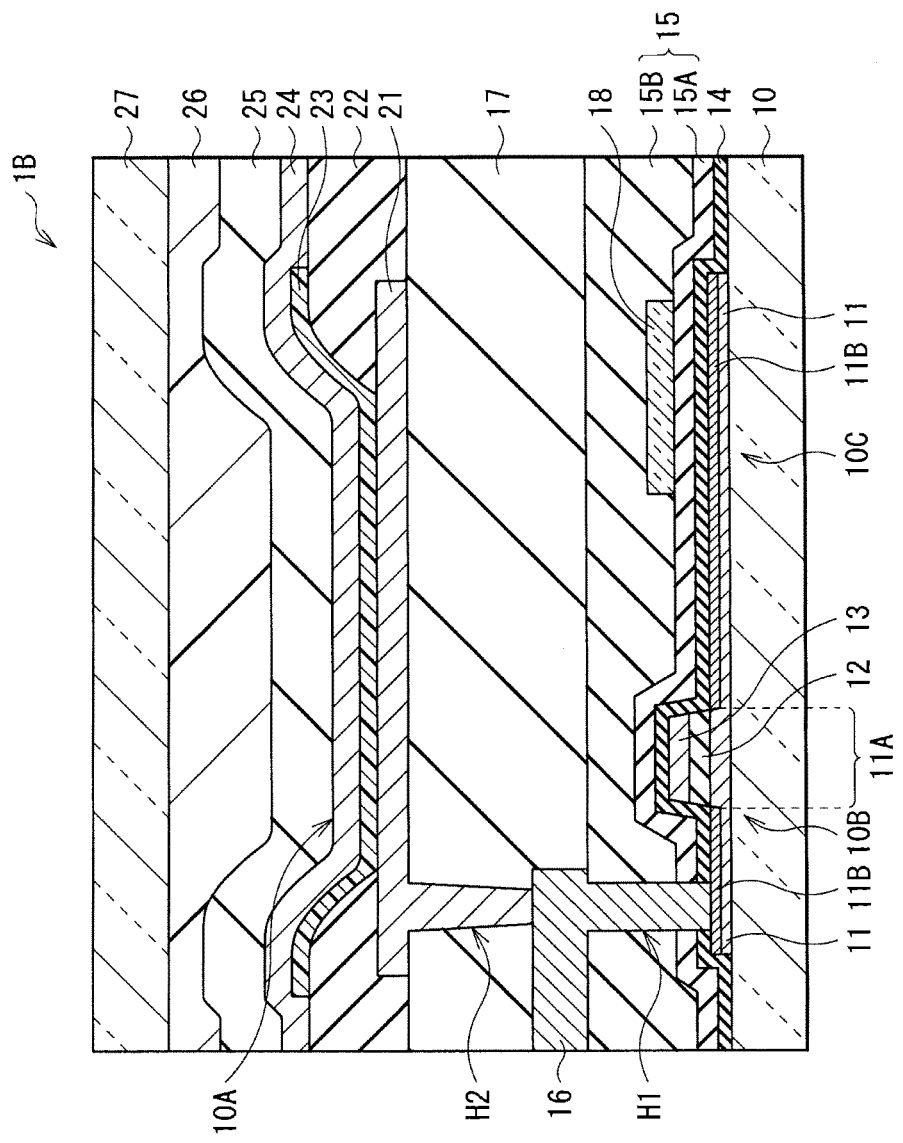
FIG. 10 is a sectional view illustrating a configuration of an organic EL display according to a second embodiment of the disclosure.

FIG. 10 illustrates a cross-sectional configuration of a display (an organic EL display 1B) according to a second embodiment of the disclosure. In the organic EL display 1B, the conductive film 18 configuring the upper electrode of the retention capacitor 10C is formed of a transparent conductive material so that the retention capacitor 10C is made transparent. Therefore, in the second embodiment, a transparent display which has a high transparency with respect to visible light and emits light toward both an upper surface and a lower surface is allowed to be configured. With such a transparent display, back of the display is shown through the display, the displayed image appears to be floating in the air, and extremely improved design is advantageously provided. The transparent display is applicable to displays for advertising and for business use, such as vending machines and refrigerators.

As a transparent conductive material of the conductive film 18, metals having high transparency with respect to visible light, such as ITO, IZO, ZnO, and TIO are used.

Except for this point, the organic EL display 1B of the second embodiment has a configuration, functions, and effects similar to those of the above-described first embodiment, and is manufactured in the similar way to the first embodiment.

[Modification 1]

Figure 11:
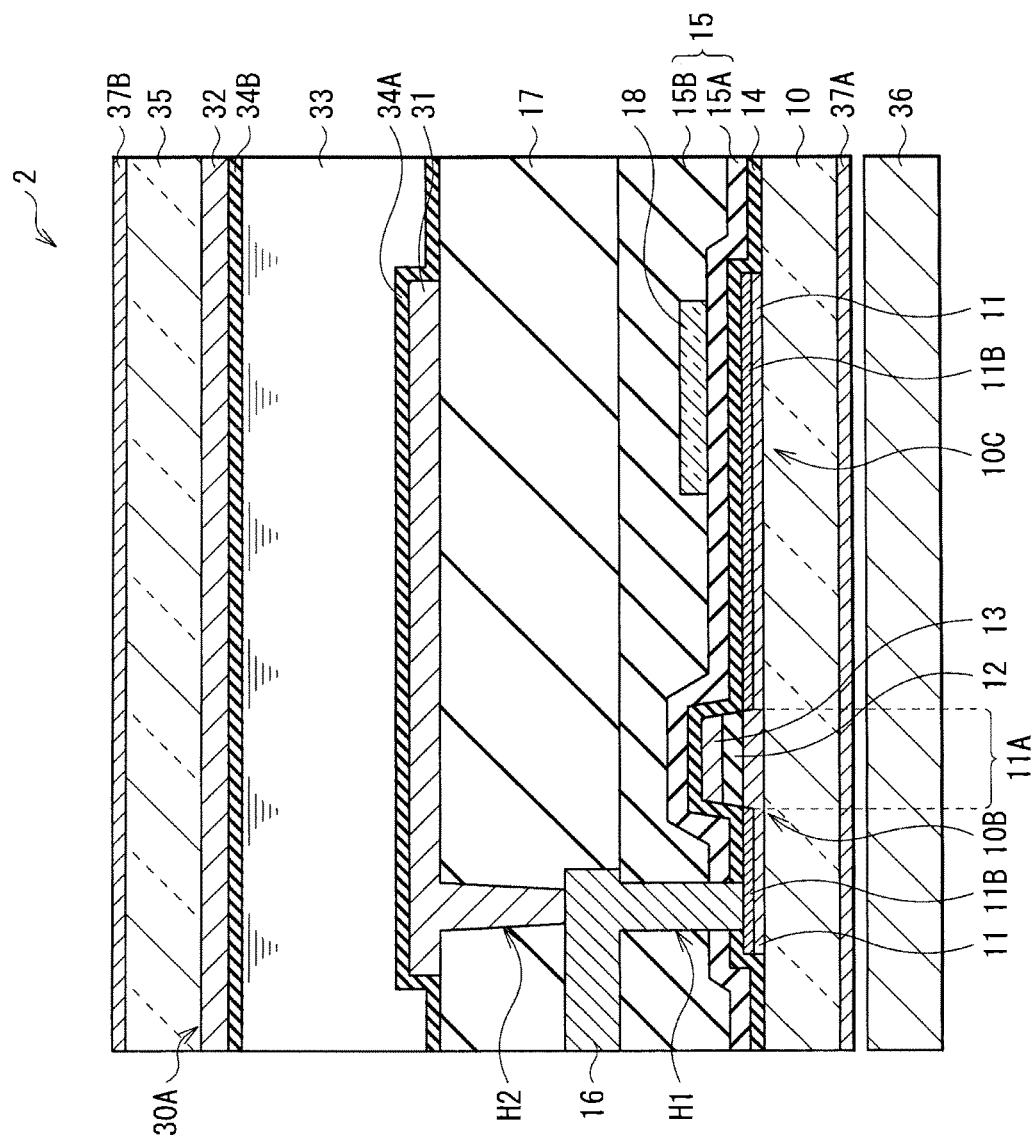
FIG. 11 is a sectional view illustrating a configuration of a liquid crystal display according to a modification 1.

FIG. 11 illustrates a cross-sectional configuration of a display (a liquid crystal display 2) according to a modification 1 of the disclosure. The liquid crystal display 2 includes a liquid crystal device 30A as a display device, instead of an organic EL device. Specifically, in the liquid crystal display 2, the transistor 10B and the retention capacitor 10C are disposed on the drive-side substrate 10, and the liquid crystal display device 30A is disposed on a layer above the transistor 10B and the retention capacitor 10C. Except for this point, the liquid crystal display 2 of the modification 1 has a configuration, functions, and effects similar to those of the first or second embodiment. Therefore, components corresponding to those in the first or second embodiment will be described with the same numerals.

The drive-side substrate 10 and the transistor 10B are configured similarly to those in the first embodiment. The retention capacitor 10C is configured similarly to that in the first or second embodiment.

The liquid crystal display device 30A is configured by sealing a liquid crystal layer 33 between a pixel electrode 31 and an opposing electrode 32. An alignment film 34A is formed on a surface on the liquid crystal layer 33 side of the pixel electrode 31, and an alignment film 34B is formed on a surface on the liquid crystal layer 33 side of the opposing electrode 32. The pixel electrode 31 is disposed for each pixel, and is electrically connected to the source/drain electrode layer 16 of the transistor 10B, for example. The opposing electrode 32 is disposed on the opposing substrate 35, as an electrode common to a plurality of pixels, and is held at a common potential, for example. The liquid crystal layer 33 is configured by a liquid crystal driven by VA (vertical alignment) mode, TN (twisted nematic) mode, IPS (in plane switching) mode, or the like.

In addition, a backlight 36 is provided on the lower side of the drive-side substrate 10, and a polarizing plate 37A is bonded on the backlight 36 side of the drive-side substrate 10 and a polarizing plate 37B is bonded to the opposing substrate 35.

The backlight 36 is a light source irradiating light toward the liquid crystal layer 33, and includes a plurality of LEDs (light emitting diodes) or a plurality of CCFLs (cold cathode fluorescent lamps). The lighting state and extinction state of the backlight 36 are controlled by a backlight drive section (not illustrated).

The polarizing plates 37A and 37B (polarizer or analyzer) are arranged in crossed-nicols with each other, and therefore, for example, allow the irradiated light from the backlight 36 to be shielded in the state of no-voltage application (off state) and allow the irradiated light to pass therethrough in the state of voltage application (on state).

In the liquid crystal display device 2, similarly to the organic EL display devices 1A and 1B of the first and second embodiments, the retention capacitor 10C is configured with the low-resistance region 11B as one electrode, and the conductive film 18 provided between the inorganic insulating film 15A and the organic insulating film 15B as the other electrode, with the high-resistance film 14 and the inorganic insulating film 15A in between. Therefore, also in the modification 1, in the retention capacitor 10C, a relatively large capacity is ensured and voltage dependency thereof is reduced. In other words, the display of the disclosure is not limited to the above-described organic EL displays 1A and 1B, and is applicable to the liquid crystal display device 2.

[Modification 2]

Figure 12:
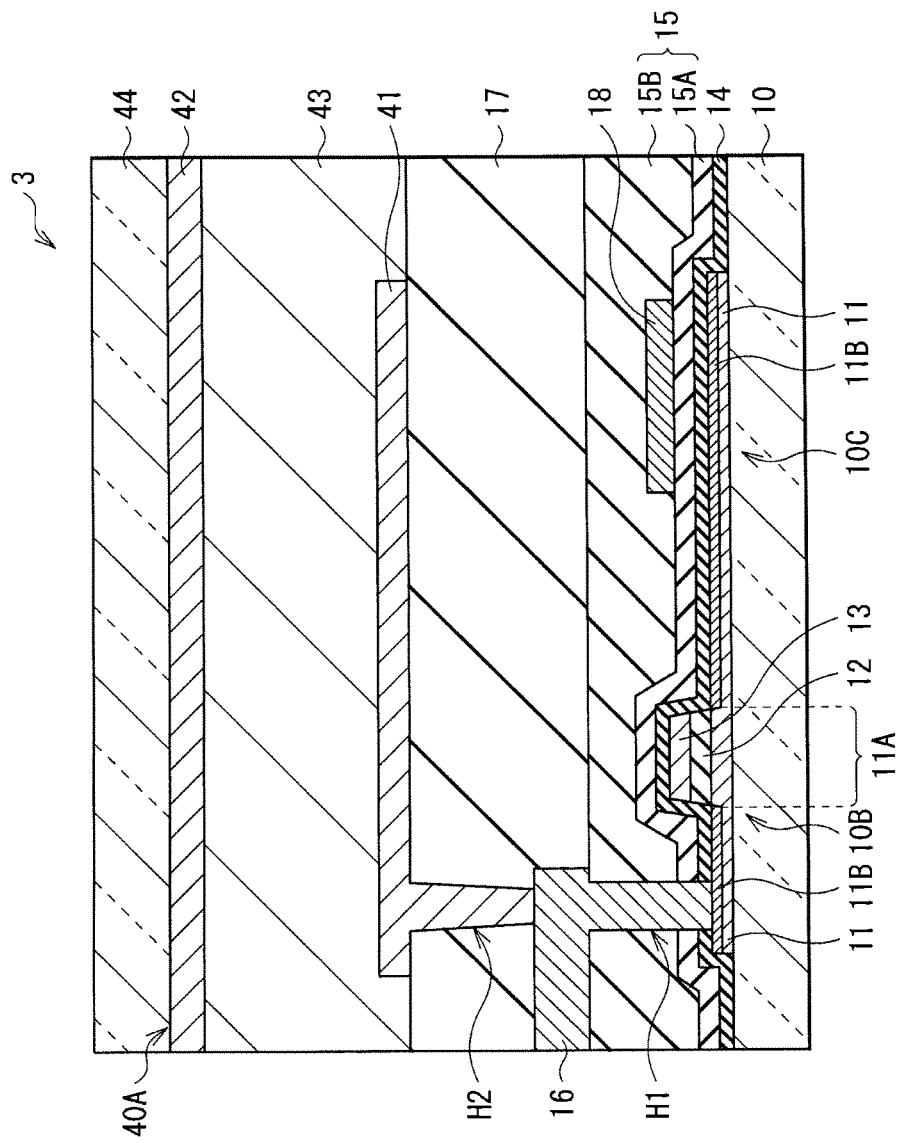
FIG. 12 is a sectional view illustrating a configuration of an electronic paper according to a modification 2.

FIG. 12 illustrates a cross-sectional configuration of a display (an electronic paper display 3) according to a modification 2 of the disclosure. The electronic paper display 3 includes an electrophoretic display device 40A as a display device, instead of an organic EL device. Specifically, in the electronic paper display 3, the transistor 10B and the retention capacitor 10C are disposed on the drive-side substrate 10, and the electrophoretic display device 40A is provided on a layer above the transistor 10B and the retention capacitor 10C. Except for this point, the electronic paper display 3 of the modification 2 has a configuration, functions, and effects similar to those of the first or second embodiment. Accordingly, components corresponding to those of the first or second embodiment are described with the same numerals.

The drive-side substrate 10 and the transistor 10B are configured similarly to those in the first embodiment. The retention capacitor 10C is configured similarly to that in the first or second embodiment.

The electrophoretic display device 40A is configured by, for example, sealing a display layer 43 made of an electrophoretic display body between a pixel electrode 41 and a common electrode 42. The pixel electrode 41 is disposed for each pixel, and is electrically connected to the source/drain electrode layer 16 of the transistor 10B. The common electrode 42 is provided on an opposing substrate 44, as an electrode common to a plurality of pixels.

In the electronic paper display 3, similarly to the organic EL displays 1A and 1B of the first and second embodiments, the retention capacitor 10C is configured with the low-resistance region 11B as one electrode and the conductive film 18 provided between the inorganic insulating film 15A and the organic insulating film 15B as the other electrode, with the high-resistance film 14 and the inorganic insulating film 15A in between. Therefore, also in the modification 2, in the retention capacitor 10C, a relatively large capacity is ensured and a voltage dependency thereof is reduced. In other words, the display of the disclosure is not limited to the organic EL displays 1A and 1B, and is applicable to the electronic paper display 3.

APPLICATION EXAMPLES

Application examples of the above-described displays (the organic EL displays 1A and 1B, the liquid crystal display 2, and the electronic paper display 3) to electronic units are described below. Examples of the electronic units include a television, a digital camera, a notebook personal computer, a portable terminal device such as a mobile phone, and a video camera. In other words, any of the displays is applicable to electronic units in various fields which display, as an image or a picture, an externally input image signal or an internally generated image signal.

[Module]

Figure 13:
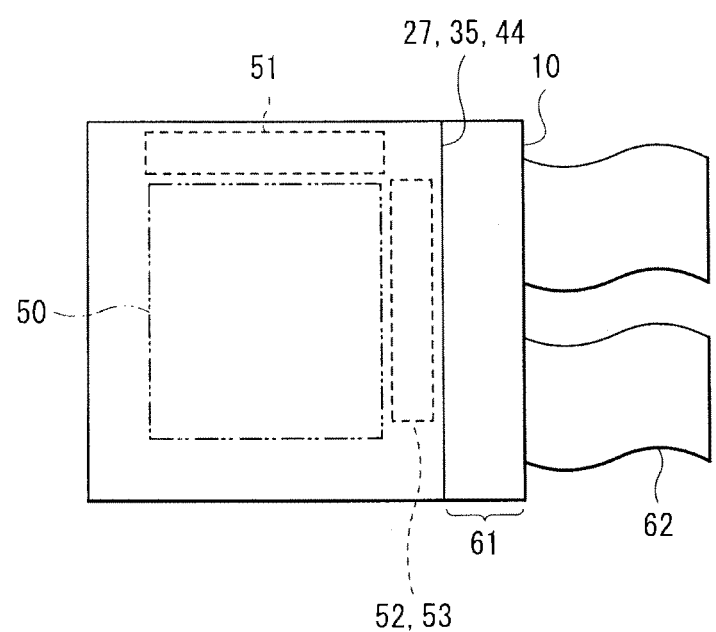

Any of the above-described displays is incorporated in various kinds of electronic units of application examples 1 to 7 described below and the like, as a module illustrated in FIG. 13, for example. In the module, for example, a region 61 which is exposed from the sealing substrate 27 or the opposing substrate 35 or 44 is provided on one side of the drive-side substrate 10, and wirings of the horizontal selector 51, the write scanner 52, and the power scanner 53 are extended to configure an external connection terminal (not illustrated) in the exposed region 61. The external connection terminal may be provided with a flexible printed circuit (FPC) 62 for inputting and outputting signals.

Application Example 1

Figure 14A:
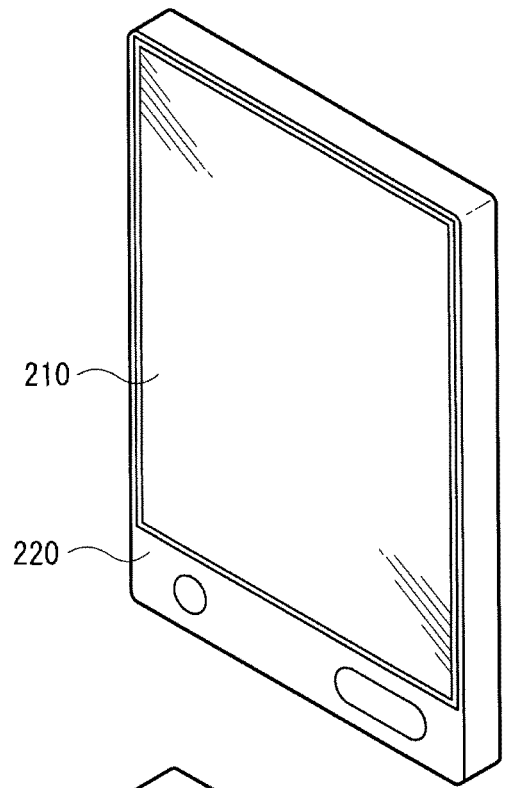
Figure 14B:
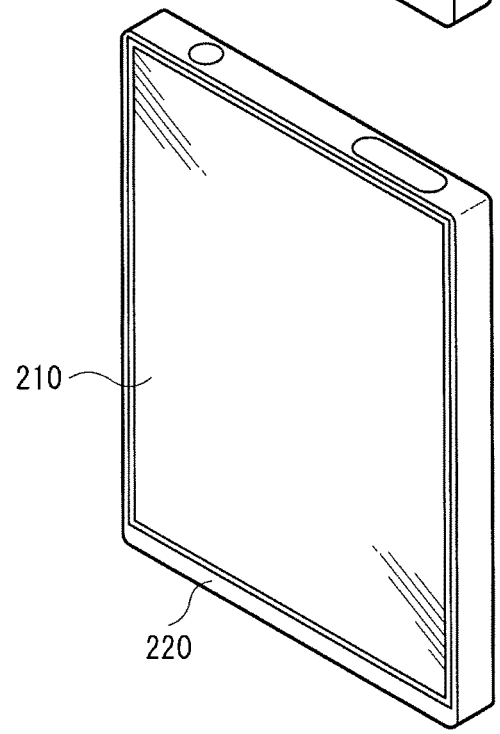

Each of FIGS. 14A and 14B illustrates an appearance of an electronic book to which the display according to any of the embodiments and the like is applied. The electronic book includes, for example, a display section 210 and a non-display section 220, and the display section 210 is configured of the display according to any of the embodiments and the like.

Application Example 2

Figure 15:
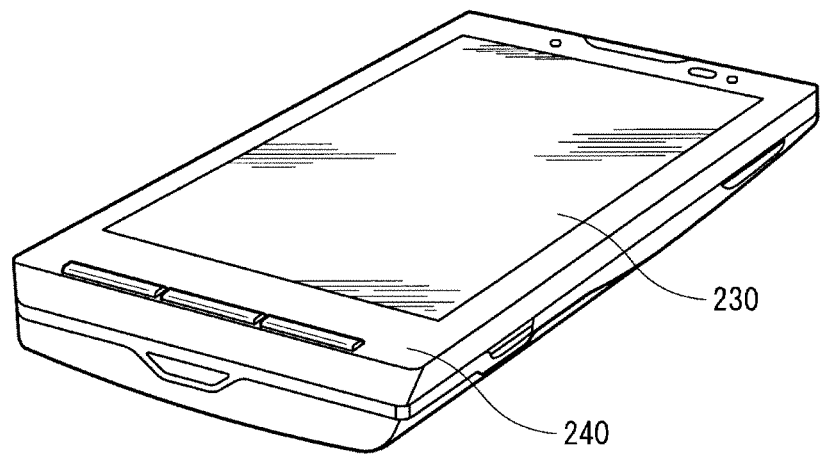
FIG. 15 is a perspective view illustrating an appearance of an application example 2.

FIG. 15 illustrates an appearance of a smartphone to which the display according to any of the embodiments and the like is applied. The smartphone includes, for example, a display section 230 and a non-display section 240, and the display section 230 is configured of the display according to any of the embodiments and the like.

Application Example 3

Figure 16:
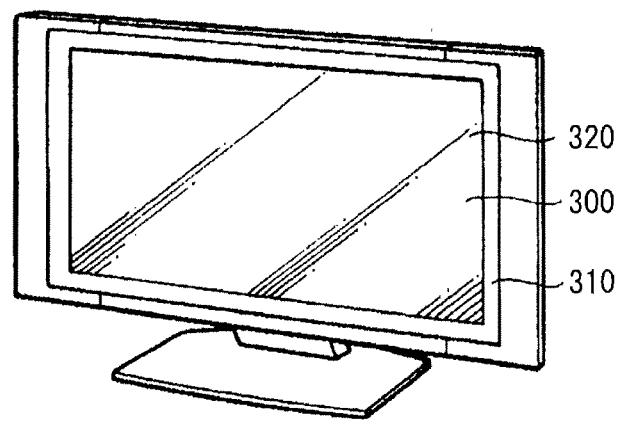
FIG. 16 is a perspective view illustrating an appearance of an application example 3.

FIG. 16 illustrates an appearance of a television to which the display according to any of the embodiments and the like is applied. The television includes, for example, an image display screen section 300 including a front panel 310 and a filter glass 320, and the image display screen section 300 is configured of the display according to any of the embodiments and the like.

Modification Example 4

Figure 17A:
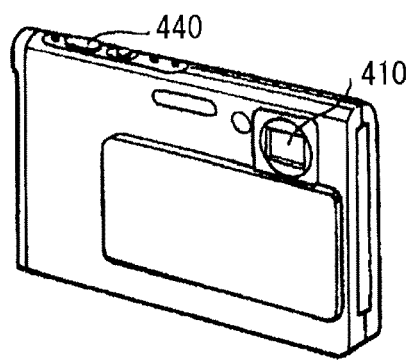
FIG. 17A is a perspective view illustrating an appearance of an application example 4 viewed from a front side thereof.
Figure 17B:
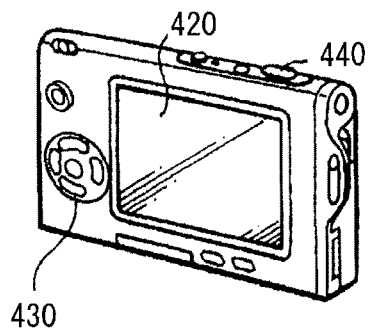
FIG. 17B is a perspective view illustrating the appearance of the application example 4 viewed from a back side thereof.

Each of FIGS. 17A and 17B illustrates an appearance of a digital camera to which the display according to any of the embodiments and the like is applied. The digital camera includes, for example, a light emitting section 410 for generating flash light, a display section 420, a menu switch 430, and a shutter button 440. The display section 420 is configured of the display according to any of the embodiments and the like.

Application Example 5

Figure 18:
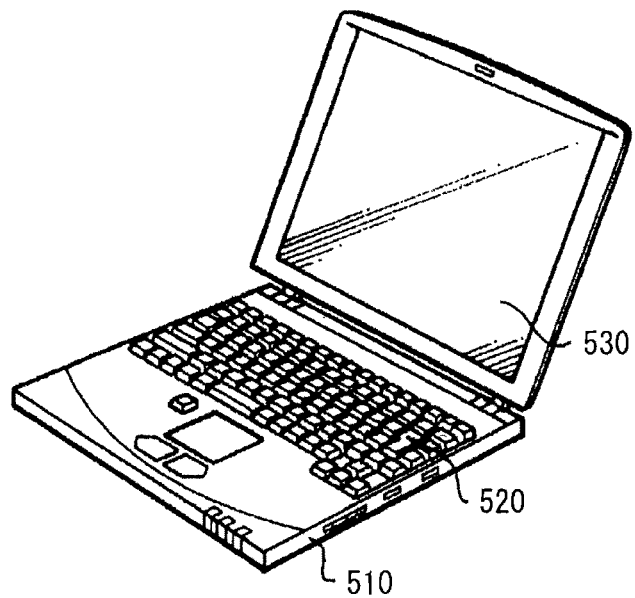
FIG. 18 is a perspective view illustrating an appearance of an application example 5.

FIG. 18 illustrates an appearance of a notebook personal computer to which the display according to any of the embodiments and the like is applied. The notebook personal computer includes, for example, a main body 510, a keyboard 520 for inputting letters and the like, and a display section 530 displaying an image. The display section 530 is configured of the display according to any of the embodiments and the like. Application Example 6

Figure 19:
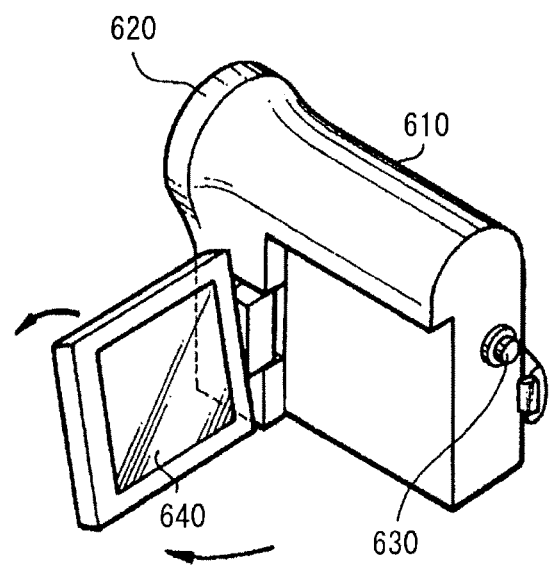
FIG. 19 is a perspective view illustrating an appearance of an application example 6.

FIG. 19 illustrates an appearance of a video camera to which the display according to any of the embodiments and the like is applied. The video camera includes, for example, a main body section 610, a lens 620 which is provided on a front side of the main body section 610 and configured to take an image of a subject, a start/stop switch 630 which is used when taking an image, and a display section 640. The display section 640 is configured of the display according to any of the embodiments and the like.

Application Example 7

Each of FIGS. 20A to 20G illustrates an appearance of a mobile phone to which the display according to any of the embodiments and the like is applied. The mobile phone is configured by connecting, for example, an upper housing 710 and a lower housing 720 with a connecting section (a hinge section) 730, and includes a display 740, a sub display 750, a picture light 760, and a camera 770. Among these components, the display 740 or the sub display 750 is configured of the display according to any of the embodiments and the like.

Hereinbefore, although the disclosure has been described with referring to the embodiments and the like, the disclosure is not limited thereto, and various modifications may be made. For example, in the above-described embodiments, the configuration having the high-resistance film 14 has been described as an example. However, the high-resistance film 14 may be removed after the low-resistance region 11B is formed. Incidentally, as described above, the high-resistance film 14 is desirably provided because the electric characteristics of the transistor 10B and the retention capacitor 10C are stably maintained.

In addition, in the above-described embodiments, as a method of allowing the predetermined region of the oxide semiconductor film 11 to be low in resistance, a method of reacting the metal film 14A with the oxide semiconductor film 11 is used. Besides the method, a method using a plasma treatment, a method using formation of a silicon nitride film by plasma CVD method and hydrogen diffusion from the silicon nitride film, or the like may be used.

Further, in the above-described embodiments, the case where the low-resistance region 11B is provided in a part of a region other than the channel region 11A of the oxide semiconductor film 11 in a thickness direction from the surface (a top surface) has been described. However, the low-resistance region 11B may be provided over the oxide semiconductor film 11 in a thickness direction from the surface.

In addition, for example, in the above-described embodiments, the case where the inter-layer insulating film 15 has the inorganic insulating film 15A and the organic insulating film 15B from the low-resistance region 11B side has been described. However, the laminated structure of the inter-layer insulating film 15 is not particularly limited as long as the inter-layer insulating film 15 has a multilayer structure including the inorganic insulating film 15A as a layer closest to the low-resistance region 11B.

Furthermore, for example, the material, the thickness, the formation method, the formation condition, and the like of each layer described in the above-described embodiments are not limited thereto, and each layer may be made of other material with other thickness by other formation method under other formation condition.

Moreover, in the above-described embodiments, the configuration of each of the organic EL device 10A, the liquid crystal display device 30A, the electrophoretic display device 40A, the transistor 10B, and the retention capacitor 10C has been described with specific examples. However, each device is not necessary provided with all layers, and may be added with other layers.

Furthermore, the disclosure is applicable to displays using other display devices such as an inorganic electroluminescence device, in addition to the organic EL display, the liquid crystal display, and the electronic paper.

In addition, for example, the configuration of the display has been specifically described in the above-described embodiments. However, all the components are not necessarily provided, and other components may be further provided.

Note that the technology may be configured as follows.

(1) A display device comprising:
a display element;
a transistor configured to drive the display element, the transistor including
a channel region; and
a retention capacitor,
wherein an oxide semiconductor film is provided in areas across the transistor and the retention capacitor, the oxide semiconductor film including
a first region formed in the channel region of the transistor, and
a second region having a lower resistance than that of the first region, the second region formed in the areas of the transistor and retention capacitor other than in the channel region.

(2) The display device according to (1), further comprising a gate insulating film formed on the oxide semiconductor film in the first region.

(3) The display device according to (3), further comprising a gate electrode formed on the gate insulating film in the first region.

(4) The display device according to (1), further comprising a high-resistance film and an interlayer insulating film provided to cover the oxide semiconductor film in the first region and the second region.

(5) The display device according to (1), wherein the oxide semiconductor film is formed of an oxide semiconductor containing one or more of indium (In), gallium (Ga), zinc (Zn), silicon (Si), and tin (Sn).

(6) The display device according to (1), wherein the oxide semiconductor film includes at least one of:
(a) an amorphous semiconductor selected from the group consisting of indium tin zinc oxide (ITZO) and indium gallium zinc oxide (IGZO or InGaZnO); and
(b) a crystalline oxide semiconductor selected from the group consisting of zinc oxide (ZnO), indium zinc oxide (IZO), indium gallium oxide (IGO), ITO, and indium oxide (InO).

(7) The display device according to (1), wherein the first and second regions of the oxide semiconductor film are formed of the same base materials, and the second region further includes a metal that has reacted and diffused into an upper surface of the oxide semiconductor film.

(8) The display device according to (1), wherein the second region includes regions corresponding to an electrode of the retention capacitor, and source and drain regions in the transistor.

(9) The display device according to (4), wherein the interlayer insulating film includes an inorganic insulating film formed on the high-resistance film, and an organic insulating film formed on the inorganic insulating film.

(10) The display device according to (9), wherein a concentration of hydrogen contained in the inorganic insulating film is preferably equal to or lower than about $1 \times 10^{20}$ cm$^{-3}$.

Note that the technology may also be configured as follows.

(11) An electronic apparatus comprising:
a display device including
a display element,
a transistor configured to drive the display element, the transistor including a channel region, and
a retention capacitor,
wherein a first oxide semiconductor film is formed in areas of the transistor and retention capacitor including the channel region, and a second lower resistance oxide semiconductor film is formed on the first oxide semiconductor film in the areas of the transistor and retention capacitor except in the channel region.

(12) The electronic apparatus according to (11), further comprising a gate insulating film formed on the oxide semiconductor film in the first region.

(13) The electronic apparatus according to (12), further comprising a gate electrode formed on the gate insulating film in the first region.

(14) The electronic apparatus according to (11), further comprising a high-resistance film and an interlayer insulating film provided to cover the oxide semiconductor film in the first region and the second region.

(15) The electronic apparatus according to (11), wherein the oxide semiconductor film is formed of an oxide semiconductor containing one or more of indium (In), gallium (Ga), zinc (Zn), silicon (Si), and tin (Sn).

(16) The electronic apparatus according to (11), wherein the oxide semiconductor film includes at least one of:
(a) an amorphous semiconductor selected from the group consisting of indium tin zinc oxide (ITZO) and indium gallium zinc oxide (IGZO or InGaZnO); and
(b) a crystalline oxide semiconductor selected from the group consisting of zinc oxide (ZnO), indium zinc oxide (IZO), indium gallium oxide (IGO), ITO, and indium oxide (InO).

(17) The electronic apparatus according to (11), wherein the first and second regions of the oxide semiconductor film are formed of the same base materials, and the second region further includes a metal that has reacted and diffused into an upper surface of the oxide semiconductor film.

(18) The electronic apparatus according to (11), wherein the second region includes regions corresponding to an electrode of the retention capacitor, and source and drain regions in the transistor.

(19) The electronic apparatus according to (14), wherein the interlayer insulating film includes an inorganic insulating film formed on the high-resistance film, and an organic insulating film formed on the inorganic insulating film.

(20) The electronic apparatus according to (19), wherein a concentration of hydrogen contained in the inorganic insulating film is preferably equal to or lower than about $1 \times 10^{20}$ cm$^{-3}$.

Note that the technology may also be configured as follows.

(21) A method of manufacturing a display device including a display element, a transistor configured to drive the display element, and a retention capacitor, the method comprising:
forming an oxide semiconductor film in areas across the transistor and the retention capacitor, the oxide semiconductor film including
a first region formed in a channel region of the transistor, and
a second region having a lower resistance than that of the first region, the second region formed in the areas of the transistor and retention capacitor other than in the channel region.

(22) The method according to (21), further comprising forming a gate insulating film on the oxide semiconductor film in the first region.

(23) The method according to (22), further comprising forming a gate electrode on the gate insulating film in the first region.

(24) The method according to (21), further comprising forming a high-resistance film and an interlayer insulating film that cover the oxide semiconductor film in the first region and the second region.

(25) The method according to (21), wherein the oxide semiconductor film is formed of an oxide semiconductor containing one or more of indium (In), gallium (Ga), zinc (Zn), silicon (Si), and tin (Sn).

(26) The method according to (21), wherein the oxide semiconductor film includes at least one of:
(a) an amorphous semiconductor selected from the group consisting of indium tin zinc oxide (ITZO) and indium gallium zinc oxide (IGZO or InGaZnO); and
(b) a crystalline oxide semiconductor selected from the group consisting of zinc oxide (ZnO), indium zinc oxide (IZO), indium gallium oxide (IGO), ITO, and indium oxide (InO).

(27) The method according to (21), wherein forming the oxide semiconductor film includes:
forming the entire oxide semiconductor film of the same base materials to form first and second regions of the oxide semiconductor film; and
modifying the second region by reacting and diffusing a metal into an upper surface of the oxide semiconductor film to thereby form the second region having a lower resistance than the first region.

(28) The method according to (21), wherein the second region includes regions corresponding to an electrode of the retention capacitor, and source and drain regions in the transistor.

(29) The method according to (24), wherein the interlayer insulating film includes an inorganic insulating film formed on the high-resistance film, and an organic insulating film formed on the inorganic insulating film.

(30) The method according to (29), wherein a concentration of hydrogen contained in the inorganic insulating film is preferably equal to or lower than about $1 \times 10^{20}$ cm$^{-3}$.

Note that the technology may also be configured as follows.

(1) A display including, on a substrate:
a transistor and a retention capacitor sharing an oxide semiconductor film;

a display device driven by the transistor; and an inter-layer insulating film provided between the display device and both the transistor and the retention capacitor, wherein the oxide semiconductor film has a channel region of the transistor, and a low-resistance region formed in a part or all in a thickness direction from a surface of a region other than the channel region, the low-resistance region having a resistivity lower than a resistivity of the channel region, the inter-layer insulating film has a multilayer structure including an inorganic insulating film as a layer closest to the low-resistance region, and the retention capacitor has, with the inorganic insulating film in between, the low resistance region as one electrode and a conductive film as the other electrode, the conductive film being provided on an opposite side of the inorganic insulating film.

(2) The display according to (1), wherein the transistor has the oxide semiconductor film on the substrate, a gate insulating film and a gate electrode are provided on the channel region of the oxide semiconductor film, and a source/drain electrode is connected to the low-resistance region of the oxide semiconductor film.

(3) The display according to (2), wherein the inorganic insulating film is configured of one or more of a silicon oxide film, a silicon nitride film, and a silicon oxynitride film.

(4) The display according to (3), wherein a concentration of hydrogen contained in the inorganic insulating film is equal to or lower than about $1 \times 10^{20}$ cm$^{-3}$.

(5) The display according to any one of (1) to (4), wherein the conductive film of the retention capacitor is formed of a transparent conductive material.

(6) The display according to any one of (1) to (5), wherein an organic electroluminescence device is included as the display device.

(7) The display according to any one of (1) to (5), wherein a liquid crystal display device is included as the display device.

(8) The display according to any one of (1) to (5), wherein an electrophoretic display device is included as the display device.

(9) An electronic unit having a display, the display including, on a substrate:

a transistor and a retention capacitor sharing an oxide semiconductor film;

a display device driven by the transistor; and an inter-layer insulating film provided between the display device and both the transistor and the retention capacitor, wherein the oxide semiconductor film has a channel region of the transistor, and a low-resistance region formed in a part or all in a thickness direction from a surface of a region other than the channel region, the low-resistance region having a resistivity lower than a resistivity of the channel region, the inter-layer insulating film has a multilayer structure including an inorganic insulating film as a layer closest to the low-resistance region, and the retention capacitor has, with the inorganic insulating film in between, the low resistance region as one electrode and a conductive film as the other electrode, the conductive film being provided on an opposite side of the inorganic insulating film.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. An electronic apparatus comprising:
a display device including
a display element,
a transistor configured to drive the display element, the transistor including a channel region, and
a retention capacitor,
a high-resistance film; and
an inorganic insulating film,
wherein an oxide semiconductor film is provided in areas across and connecting the transistor and retention capacitor, the oxide semiconductor film including a first region formed in the channel region of the transistor, and in the areas of the transistor and retention capacitor other than in the channel region, and a second region having a lower resistance than that of the first region, the second region provided in the area of the capacitor,
wherein the high-resistance film and the inorganic insulating film cover the oxide semiconductor film in the first region and the second region and are provided in between an upper electrode and a lower electrode of a pair of electrodes of the retention capacitor, and
wherein the upper electrode of the pair of electrodes is covered by an organic film, and a source/drain electrode of the transistor is formed on the organic film.

2. The electronic apparatus according to claim 1, wherein the oxide semiconductor film includes at least one selected from the group consisting of indium (In), gallium (Ga), zinc (Zn), silicon (Si), and tin (Sn).

3. The electronic apparatus according to claim 1, wherein the second region further includes a metal that has reacted and diffused into an upper surface of the oxide semiconductor film.

4. The electronic apparatus according to claim 1, wherein the second region further includes regions corresponding to source and drain regions in the transistor.

5. A display device comprising:
a display element;
a transistor configured to drive the display element, the transistor including a channel region; and
a retention capacitor;
a high-resistance film; and
an inorganic insulating film,
wherein an oxide semiconductor film is provided in areas across and connecting the transistor and the retention capacitor, the oxide semiconductor film including
a first region formed in the channel region of the transistor, and in the areas of the transistor and retention capacitor other than in the channel region, and
a second region having a lower resistance than that of the first region, the second region provided in the area of the capacitor,
wherein the high-resistance film and the inorganic insulating film cover the oxide semiconductor film in the first region and the second region and are provided in between an upper electrode and a lower electrode of a pair of electrodes of the retention capacitor, and
wherein the upper electrode of the pair of electrodes is covered by an organic film, and a source/drain electrode of the transistor is formed on the organic film.

6. The display device according to claim 5, further comprising a gate insulating film formed on the oxide semiconductor film in the first region.

7. The display device according to claim 5, wherein the oxide semiconductor film is formed of an oxide semiconductor containing one or more of indium (In), gallium (Ga), zinc (Zn), silicon (Si), and tin (Sn).

8. The display device according to claim 5, wherein the oxide semiconductor film includes at least one of:
 (a) an amorphous semiconductor selected from the group consisting of indium tin zinc oxide (ITZO) and indium gallium zinc oxide (IGZO or InGaZnO); and
 (b) a crystalline oxide semiconductor selected from the group consisting of zinc oxide (ZnO), indium zinc oxide (IZO), indium gallium oxide (IGO), ITO, and indium oxide (InO).

9. The display device according to claim 5, wherein the first and second regions of the oxide semiconductor film are formed of the same base materials, and the second region further includes a metal that has reacted and diffused into an upper surface of the oxide semiconductor film.

10. The display device according to claim 5, wherein the second region includes regions corresponding to an electrode of the retention capacitor, and source and drain regions in the transistor.

11. The display device according to claim 5, further comprising an interlayer insulating film, wherein the interlayer insulating film includes an inorganic insulating film formed on the high-resistance film, and an organic insulating film formed on the inorganic insulating film.

12. The display device according to claim 11, wherein a concentration of hydrogen contained in the inorganic insulating film is preferably equal to or lower than about $1 \times 10^{20}$ $cm^{-3}$.

* * * * *